United States Patent
Chen et al.

(10) Patent No.: US 9,894,798 B2
(45) Date of Patent: Feb. 13, 2018

(54) SUPPORT ASSEMBLY AND SUPPORT DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Yao-Tsung Chen, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 61 days.

(21) Appl. No.: 15/044,067

(22) Filed: Feb. 15, 2016

(65) Prior Publication Data

US 2017/0105524 A1    Apr. 20, 2017

(30) Foreign Application Priority Data

Oct. 16, 2015   (TW) .............................. 104134165 A

(51) Int. Cl.
```
H05K 7/18       (2006.01)
A47B 88/00      (2017.01)
A47B 88/04      (2006.01)
A47B 88/16      (2006.01)
H05K 7/14       (2006.01)
```

(52) U.S. Cl.
CPC ............. H05K 7/183 (2013.01); A47B 88/00 (2013.01); A47B 88/044 (2013.01); A47B 88/0407 (2013.01); A47B 88/0477 (2013.01); A47B 88/16 (2013.01); H05K 7/1489 (2013.01)

(58) Field of Classification Search
CPC .. H05K 7/183; H05K 7/1489; A47B 88/0407; A47B 88/044; A47B 88/0477; A47B 88/16; A47B 88/00; A47B 88/0418; A47B 88/042; A47F 7/00
USPC ........ 248/201; 211/189, 26; 312/334.7, 333, 312/334.8, 334.46, 334.44, 330.1, 223.1, (Continued)

(56) References Cited

U.S. PATENT DOCUMENTS 6,220,456 B1 * 4/2001 Jensen ...................... G06F 1/16
                                                                     211/189
6,702,412 B2 * 3/2004 Dobler ................. A47B 88/407
                                                                     312/205

(Continued)

FOREIGN PATENT DOCUMENTS

GB          2487624      3/2013
JP          S4985341     7/1974
(Continued)

*Primary Examiner* — Nkeisha Smith
(74) *Attorney, Agent, or Firm* — Winston Hsu

(57) ABSTRACT

A support device includes a support element, a linking element and a blocking element. A mounting path is formed on the support element for holding a plurality of mounting elements of an object. The blocking element is configured to be driven by the linking element. When the blocking element is located at a first position, the blocking element blocks the mounting path of the support element. When the blocking element is located at a second position, the blocking element does not block the mounting path of the support element.

10 Claims, 10 Drawing Sheets

(58) Field of Classification Search
USPC ......... 312/265.1, 265.4, 319.1, 334.1, 334.4, 312/334.5
See application file for complete search history.

(56) References Cited

U.S. PATENT DOCUMENTS

| | | | | |
|---|---|---|---|---|
| 7,036,783 B2* | 5/2006 | Chen | ................... | G11B 33/128 248/222.11 |
| 7,137,512 B2* | 11/2006 | Nguyen | ................. | G06F 1/183 211/183 |
| 7,299,933 B2* | 11/2007 | Chen | ................... | G11B 33/128 211/26 |
| 7,318,531 B2* | 1/2008 | Wu | ..................... | G11B 33/128 211/26 |
| 8,061,535 B2* | 11/2011 | Cheng-Yuan | ........ | G11B 33/127 211/26 |
| 8,127,940 B2* | 3/2012 | Henderson | ........... | H05K 7/1489 211/26 |
| 8,147,011 B2* | 4/2012 | Chen | ...................... | F16C 29/04 312/333 |
| 8,317,037 B2 | 11/2012 | Henderson | | |
| 8,869,994 B2* | 10/2014 | He | ...................... | H05K 7/1489 211/26 |
| 9,010,887 B1* | 4/2015 | Shao | ................... | H05K 7/1489 312/319.1 |
| 9,215,929 B2* | 12/2015 | Brunnmayr | ........ | A47B 88/0481 |
| 9,375,083 B2* | 6/2016 | Haemmerle | ........... | A47B 88/04 |
| 9,382,943 B2* | 7/2016 | Judge | .................... | F16C 29/048 |
| 2002/0074914 A1* | 6/2002 | Shih | ....................... | A47B 88/43 312/334.4 |
| 2003/0141791 A1 | 7/2003 | Dubon | | |
| 2004/0217073 A1* | 11/2004 | Dobler | ................ | H05K 7/1421 211/26 |
| 2009/0102339 A1* | 4/2009 | Weng | ................... | E05B 65/463 312/333 |
| 2009/0195133 A1* | 8/2009 | Chang | .................... | A47B 88/57 312/334.46 |
| 2010/0019638 A1* | 1/2010 | Duan | .................. | H05K 7/1489 312/334.44 |
| 2010/0140195 A1 | 6/2010 | Henderson | | |
| 2012/0170877 A1 | 7/2012 | Yu | | |
| 2015/0090677 A1* | 4/2015 | Shao | ................... | H05K 7/1489 211/26 |
| 2015/0181753 A1* | 6/2015 | Murakami | ........... | H05K 7/1489 211/26 |

FOREIGN PATENT DOCUMENTS

| | | |
|---|---|---|
| JP | H06154053 A | 6/1994 |
| JP | H10137063 A | 5/1998 |
| JP | H10184151 A | 7/1998 |
| JP | 200137563 A | 2/2001 |
| JP | 3173757 U | 2/2012 |

* cited by examiner

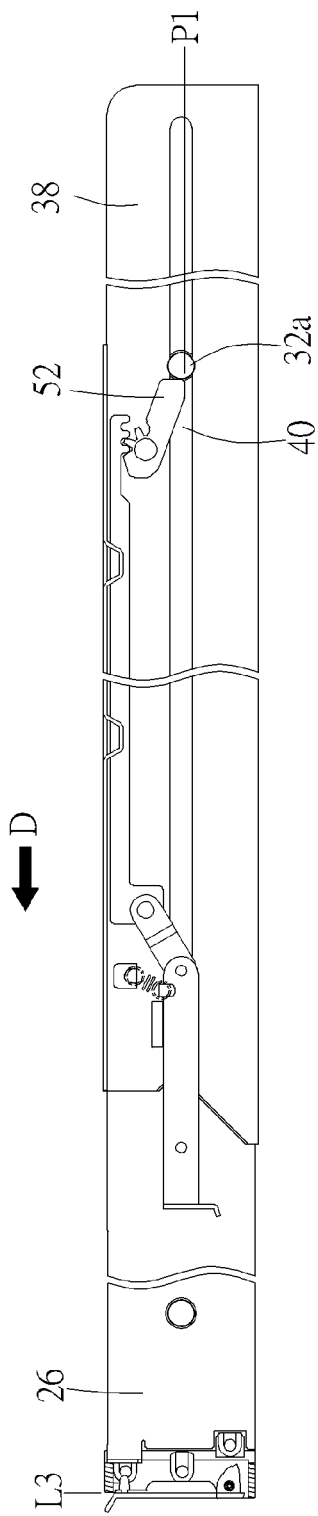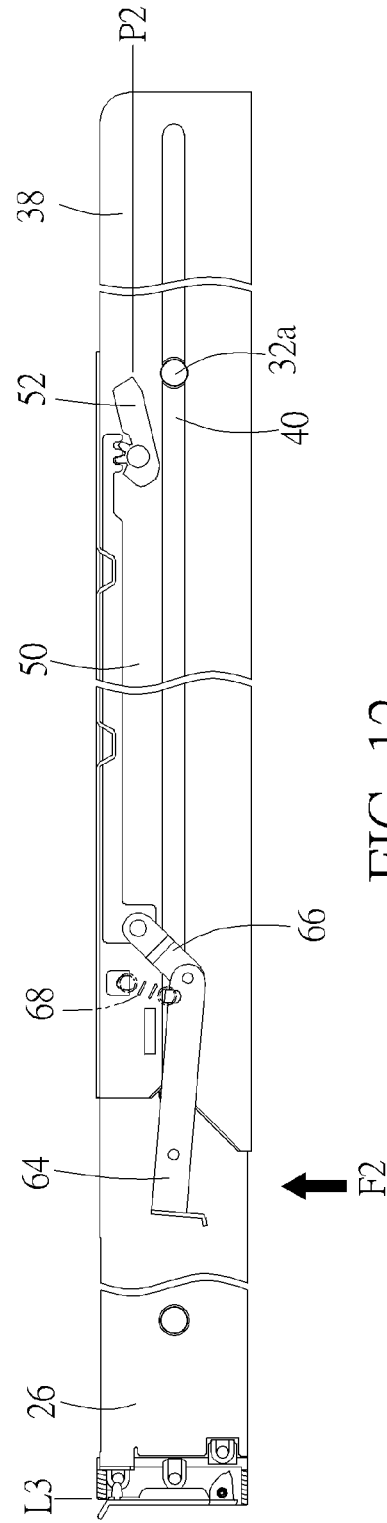
FIG. 11
FIG. 12

SUPPORT ASSEMBLY AND SUPPORT DEVICE THEREOF

BACKGROUND OF THE INVENTION

1. Field of the Invention

The present invention relates to a support assembly, and more particularly, to a support assembly and a support device configured to support an object on a rack.

2. Description of the Prior Art

Generally, in a rack system, a carried object can be mounted to a plurality of posts of a rack by a pair of support rails. For example, U.S. Pat. No. 8,317,037 B2 discloses a rack system, which comprises a support rail (106) configured to mount an information equipment (104) to a post (138) of a rack (102). Wherein, the support rail (106) has a slot (214) configured to accommodate a guiding structure of the information equipment (104), and the support rail (106) has a frame (108) configured to support the information equipment (104). The patent provides a technique for mounting the information equipment (104) to the support rail (106). However, methods for mounting the carried object to the support rail might be different due to different market requirements. For example, when mounting the carried object to the support rail, the carried object can be blocked or locked on the support rail in a tool-free manner, such that the carried object is not detachable from the support rail. As such, the market can have various selections.

SUMMARY OF THE INVENTION

The present invention relates to a support device capable of supporting an object on a rack.

According to an embodiment of the present invention, a support device is configured to support an object comprising a plurality of mounting elements. The support device comprises a support element, a first linking element and a blocking element. A mounting path is formed on the support element for holding the plurality of mounting elements of the object. The blocking element is configured to be driven by the first linking element to move. Wherein, when the blocking element is located at a first position, the blocking element blocks the mounting path of the support element. Wherein, when the blocking element is located at a second position, the blocking element does not block the mounting path of the support element.

According to the above embodiment, the support device further comprises an operating element. The first linking element is configured to drive the blocking element in response to operation of the operating element.

Preferably, the support device further comprises a second linking element connected between the operating element and the first linking element.

Preferably, the second linking element is pivoted to the operating element and the first linking element respectively by a first pivoting element and a second pivoting element.

Preferably, the support device further comprises an elastic element arranged between the support element and the operating element. The blocking element is held at the first position in response to an elastic force of the elastic element. The elastic element is arranged between the support element and the operating element.

According to the above embodiment, the first linking element has a first engaging part. The blocking element has a second engaging part engaged with the first engaging part.

According to the above embodiment, the support element comprises a base part and a vertical part bent from the base part. The base part is configured to support the object. The mounting path is located at the vertical part.

According to another embodiment of the present invention, a support assembly is configured to support an object on a rack. The object comprises a plurality of mounting elements. The support assembly comprises an auxiliary element and a support device. The auxiliary element is configured to be mounted to the rack by a first bracket and a second bracket. The support device is attached to the auxiliary element. The support device comprises a support element, a first linking element and a blocking element. The support element is configured to support the object. A mounting path is formed on the support element. The blocking element is movably connected between the support element and the first linking element. Wherein, when the object is mounted to the support element, the mounting path of the support element is configured to hold the plurality of mounting elements of the object, and the blocking element blocks the mounting path of the support element in order to stop the object from moving relative to the support element along a direction. Wherein, when the blocking element is driven by the first linking element to move, the blocking element no longer blocks the mounting path of the support element, such that the object is movable relative to the support element along the direction.

According to the above embodiment, the support assembly further comprises an operating element. The first linking element is configured to drive the blocking element in response to operation of the operating element.

Preferably, the object further comprises an opening element. When the object is located at a first mounting position relative to the support element, the first linking element is configured to drive the blocking element in response to the opening element of the object driving the operating element, such that one of the plurality of mounting elements of the object is not blocked by the blocking element. When the object is located at a second mounting position relative to the support element, the first linking element is configured to drive the blocking element in response to the operation of operating element, such that another one of the plurality of the mounting elements of the object is not blocked by the blocking element.

Preferably, the support assembly further comprises an elastic element arranged between the support element and the operating element. The blocking element is held to block the mounting path in response to an elastic force of the elastic element.

According to the above embodiment, the support assembly further comprises a connecting element arranged between the support element and the auxiliary element. The connecting element comprises a first wing part, a second wing part and a protrusion part connected between the first wing part and the second wing part.

According to another embodiment of the present invention, a support device comprises a support element, a first linking element and a blocking element. A mounting path is formed on the support element. The blocking element is configured to be driven by the first linking element to move between a first position and a second position. Wherein, when the blocking element is located at the first position, the blocking element blocks the mounting path of the support element. Wherein, when the blocking element is located at the second position, the blocking element does not block the mounting path of the support element.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 11 is a diagram showing the object in FIG. 10 being further moved along the direction, and the blocking element blocking a first mounting element of the object.

FIG. 12 is a diagram showing an operating element in FIG. 11 being operated, and the blocking element no longer blocking the first mounting element of the object.

DETAILED DESCRIPTION

Figure 1:
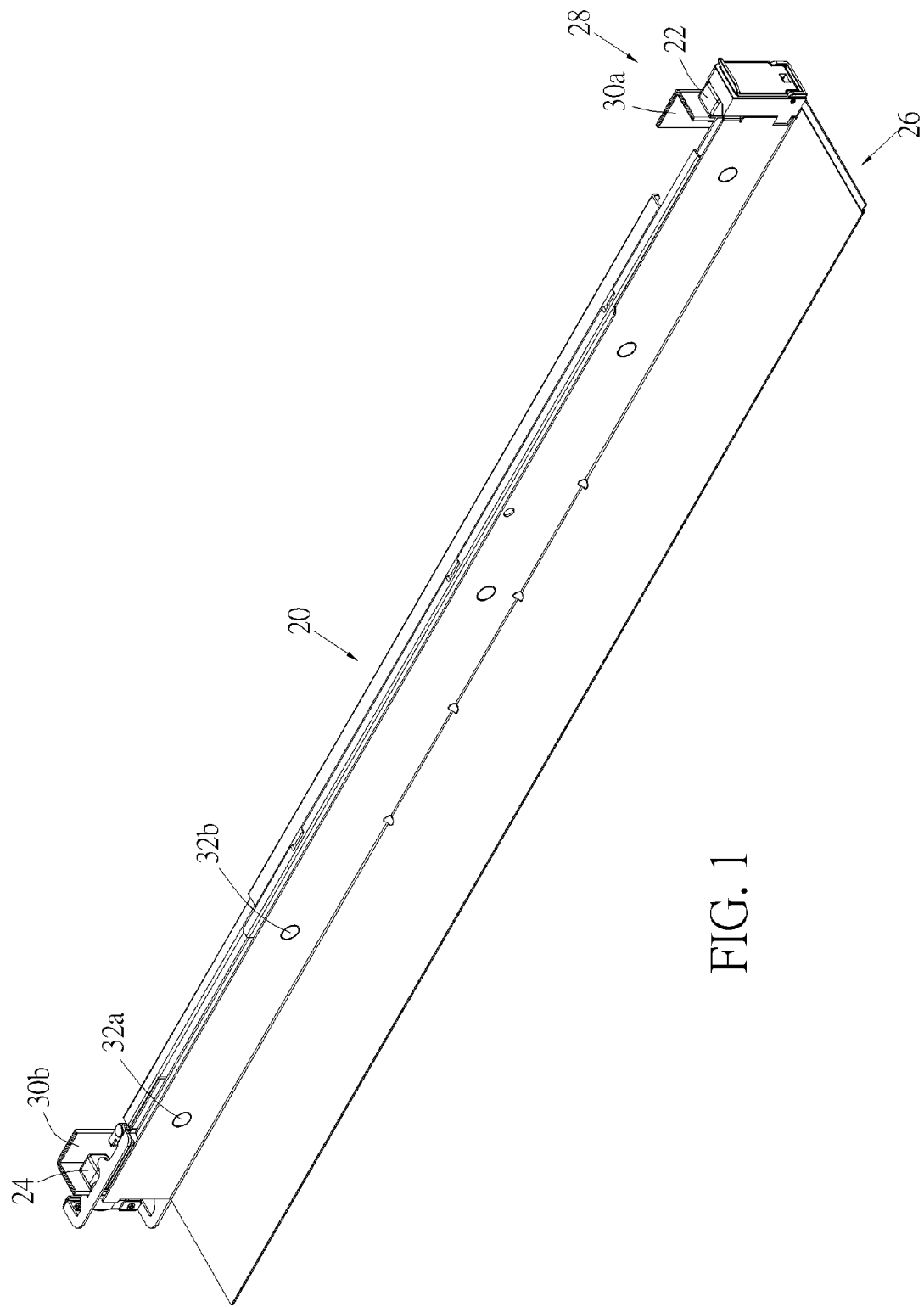
FIG. 1 is a diagram showing a support assembly mounting an object to a rack according to an embodiment of the present invention.
Figure 2:
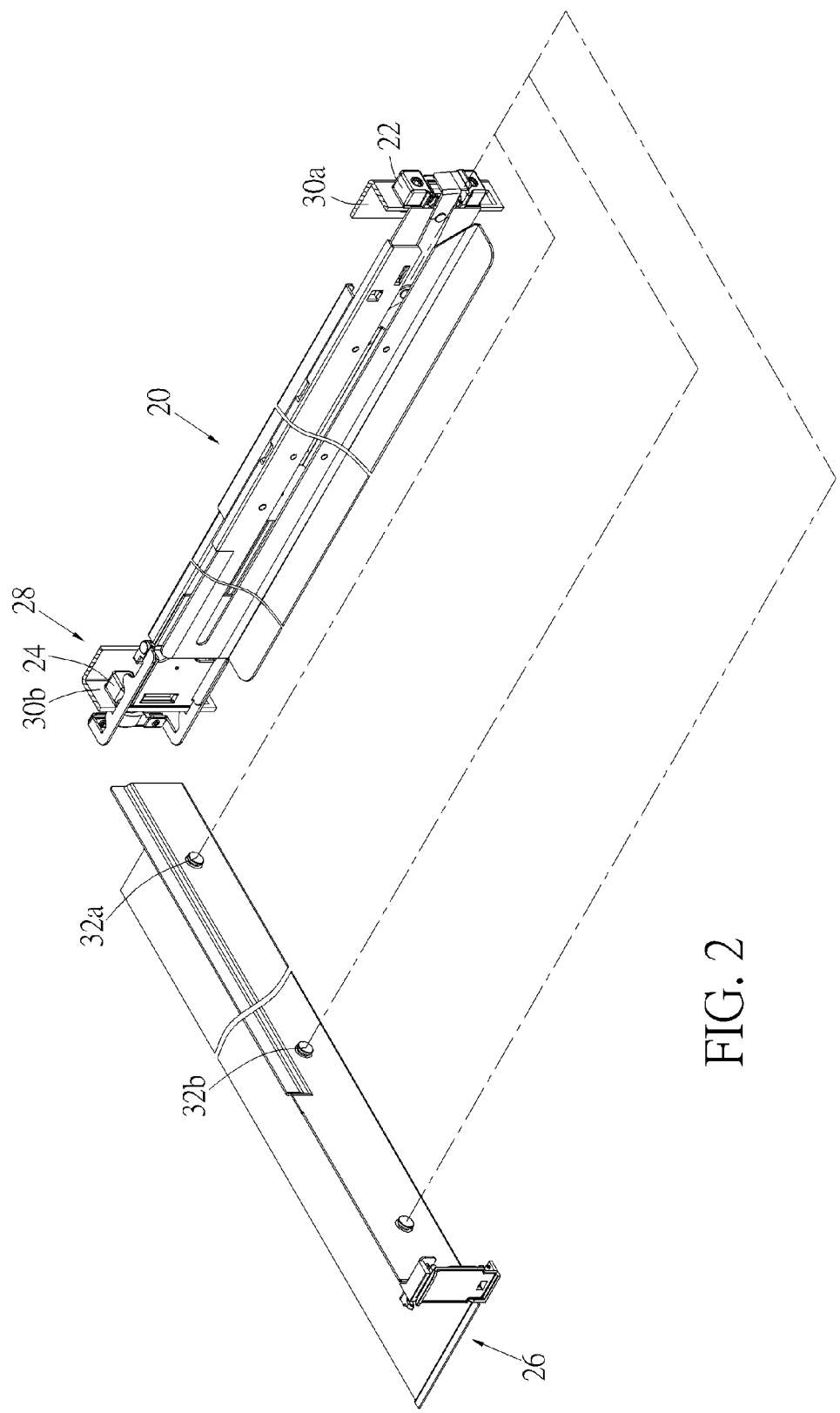
FIG. 2 is an exploded view of the support assembly and the object according to an embodiment of the present invention.

As shown in FIG. 1 and FIG. 2, a support assembly 20 is configured to be mounted to a first post 30a and a second post 30b of a rack 28 through a first bracket 22 and a second bracket 24 for supporting an object 26 according to an embodiment of the present invention. The object 26 can be an electronic device, a chassis, or a drawer. The object 26 comprises a plurality of mounting elements, such as a first mounting element 32a and a second mounting element 32b. The plurality of mounting elements are separated from each other.

Figure 3:
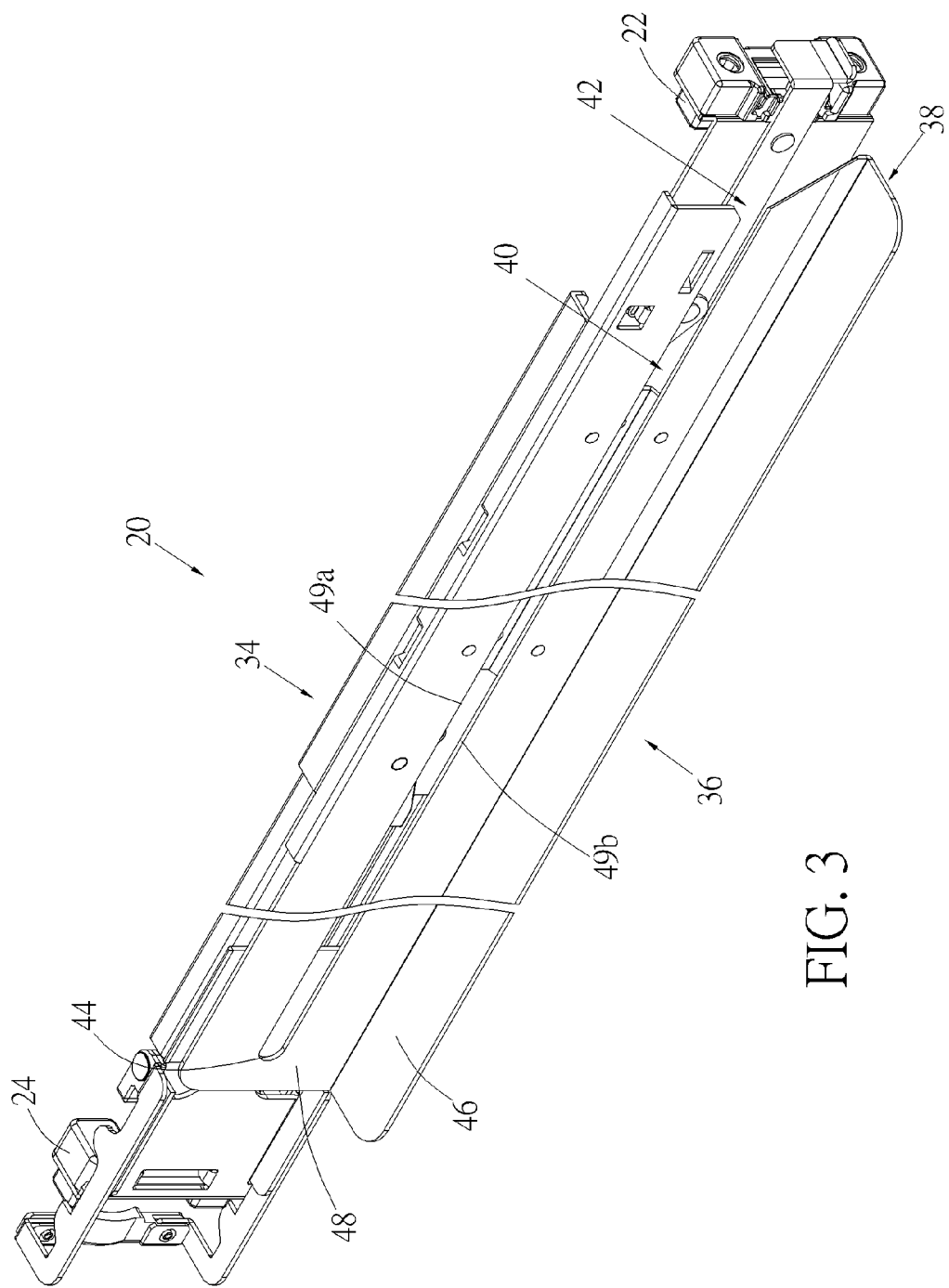
FIG. 3 is a diagram showing the support assembly according to an embodiment of the present invention.

As shown in FIG. 2 and FIG. 3, the support assembly 20 comprises an auxiliary element 34 and a support device 36. Wherein, the first bracket 22 and the second bracket 24 are arranged on the auxiliary element 34 and adjacent to two parts (such as a front part and a rear part) of the auxiliary element 34 respectively. The support device 36 is attached to the auxiliary element 34. The support device 36 comprises a support element 38 configured to support the object 26. A mounting path 40 is formed on the support element 38. In the present embodiment, the support element 38 has an entrance 42 and a closed part 44. Preferably, the mounting path 40 is extended along the support element 38 and located between the entrance 42 and the closed part 44. Specifically, the entrance 42 communicates with the mounting path 40 to allow the plurality of mounting elements of the object 26, such as the first mounting element 32a and the second mounting element 32b, to enter the mounting path 40 from the entrance 42 for being mounted to the support element 38. Preferably, the support element 38 comprises a base part 46 and a vertical part 48 bent from the base part 46. For example, the vertical part 48 is substantially perpendicularly connected to the base part 46. Wherein, the base part 46 is configured to support the object 26, and the mounting path 40 is arranged on the vertical part 48. Preferably, the vertical part 48 has an upper support section 49a and a lower support section 49b. The mounting path 40 is defined by the upper support section 49a, the lower support section 49b and the closed part 44.

Figure 4:
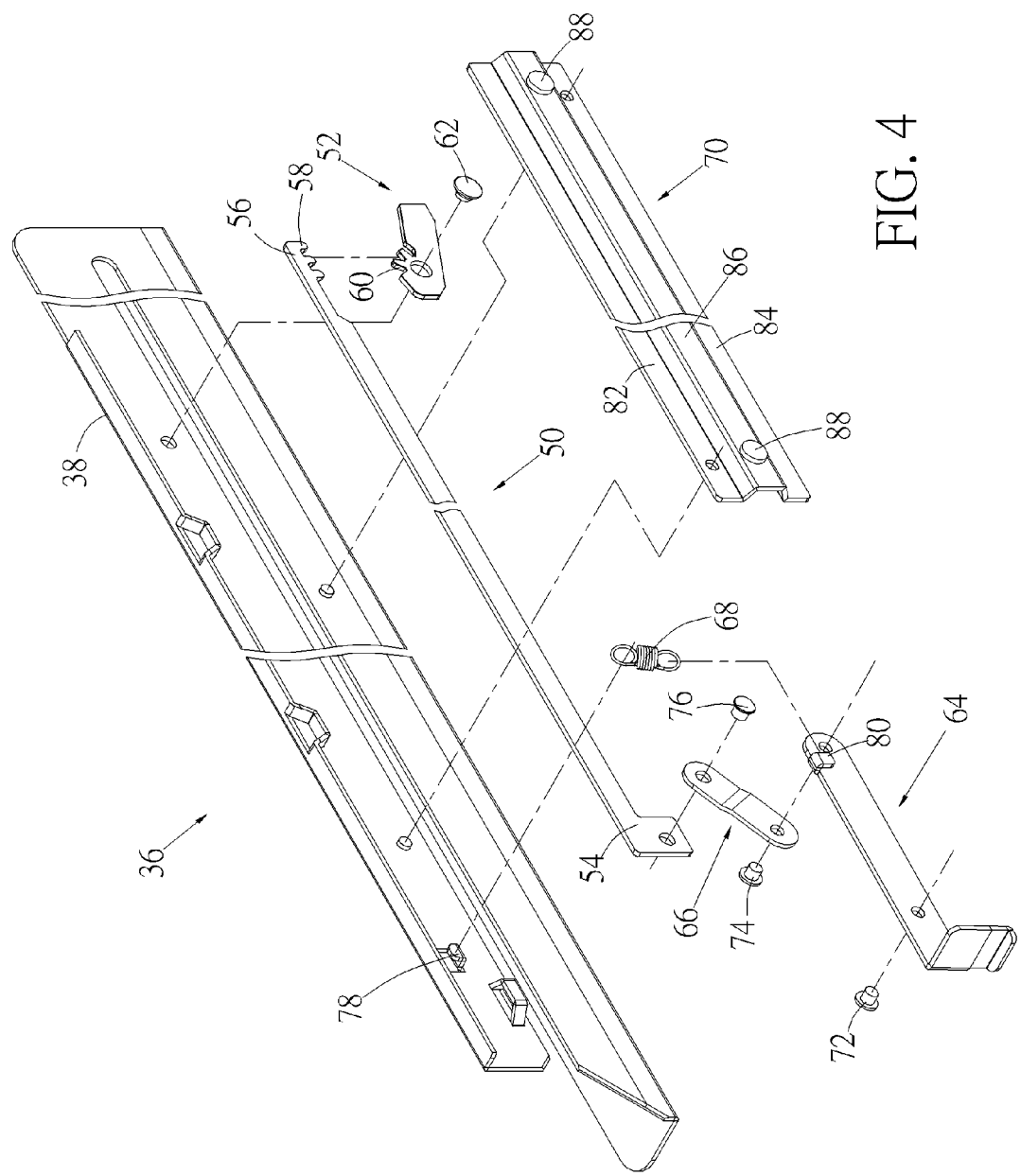
FIG. 4 is an exploded view of a support device according to an embodiment of the present invention.
Figure 5:
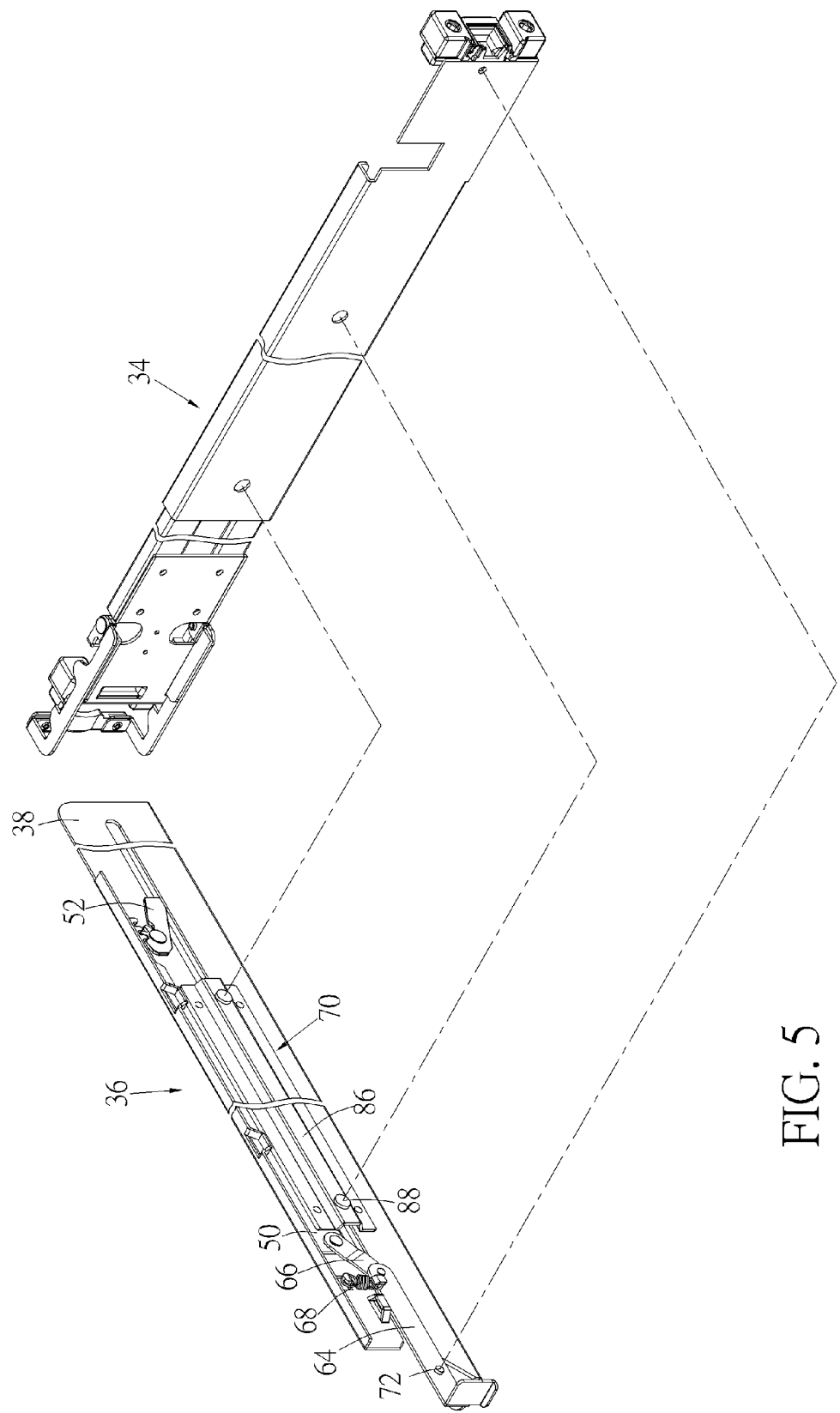
FIG. 5 is an exploded view of the support assembly according to an embodiment of the present invention.

As shown in FIG. 4 and FIG. 5, the support device 36 further comprises a first linking element 50 and a blocking element 52. The first linking element 50 comprises a first part 54 and a second part 56. The second part 56 is located opposite to the first part 54. The blocking element 52 is connected to the support element 38. Specifically, the blocking element 52 is adjacent to the second part 56 of the first linking element 50. Preferably, the first linking element 50 has a first engaging part 58. The blocking element 52 has a second engaging part 60 engaged with the first engaging part 58. Preferably, the blocking part 52 is connected to, such as pivoted to the support element 38 by a first shaft element 62.

Preferably, the support device 36 further comprises an operating element 64, a second linking element 66, an elastic element 68 and a connecting element 70. The operating element 64 is connected to, such as pivoted to the auxiliary element 34 by a second shaft element 72. The second linking element 66 is connected between the operating element 64 and the first linking element 50. In the present embodiment, the second linking element 66 is pivoted to the operating element 64 by a first pivoting element 74 and pivoted to the first part 54 of the first linking element 50 by a second pivoting element 76. The elastic element 68 is arranged between the support element 38 and the operating element 64. For example, the support element 38 has a first connecting feature 78, and the operating element 64 has a second connecting feature 80. The first connecting feature 78 and the second connecting feature 80 are configured to mount the elastic element 68. The connecting element 70 is arranged between the support element 38 and the auxiliary element 34. Specifically, the connecting element 70 comprises a first wing part 82, a second wing part 84 and a protrusion part 86 connected between the first wing part 82 and the second wing part 84. The first wing part 82 and the second wing part 84 are attached to the support element 38. The protrusion part 86 is connected to the auxiliary element 34 by at least one mounting feature 88.

Figure 6:
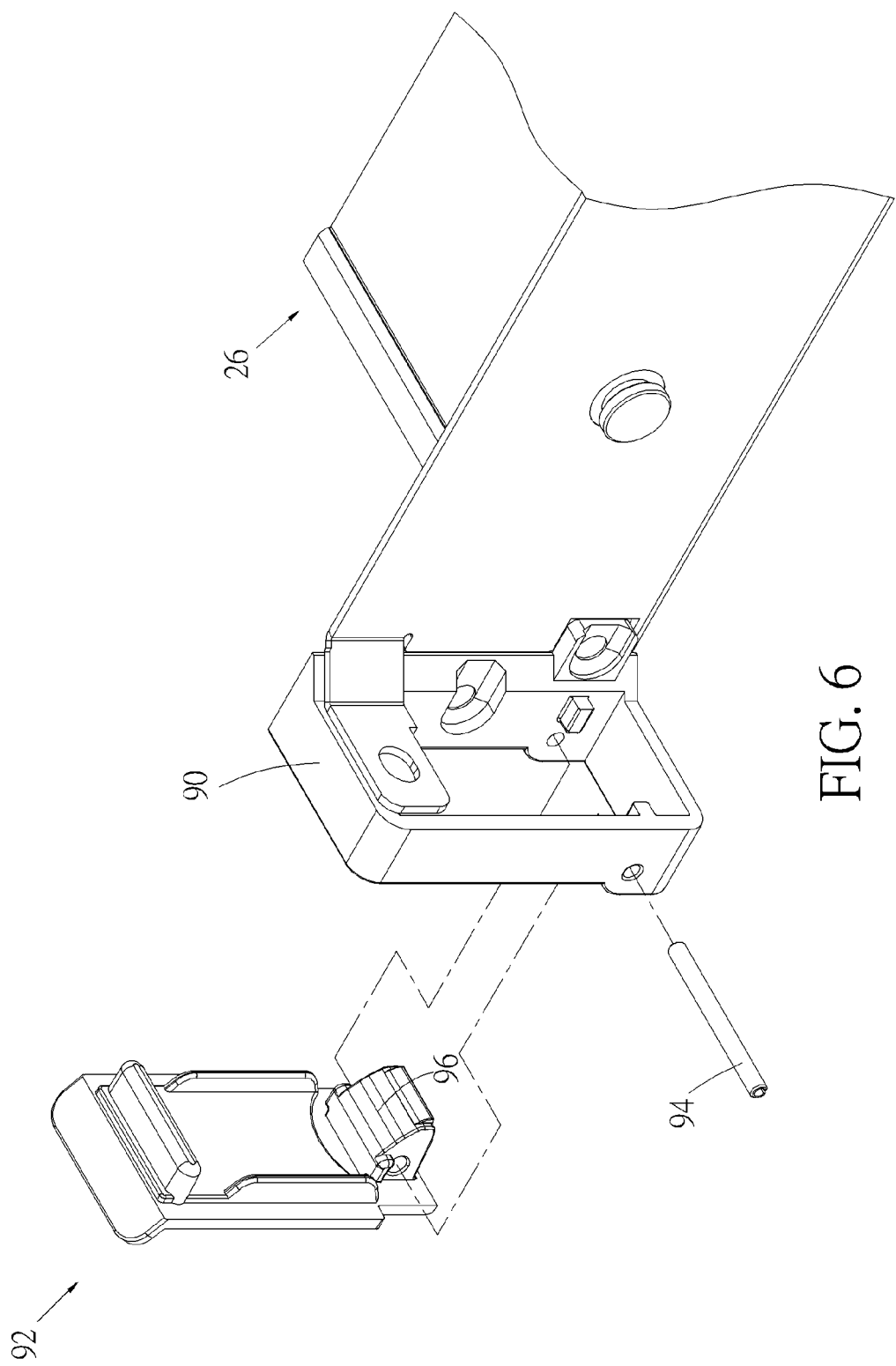
FIG. 6 is a partial exploded view of the object according to an embodiment of the present invention.

As shown in FIG. 6, the object 26 further comprises an ear part 90 and an opening element 92 connected to the ear part 90. In the present embodiment, the opening element 92 is connected to the ear part 90 by a third shaft 94. Preferably, the opening element 92 has a push part 96.

Figure 7:
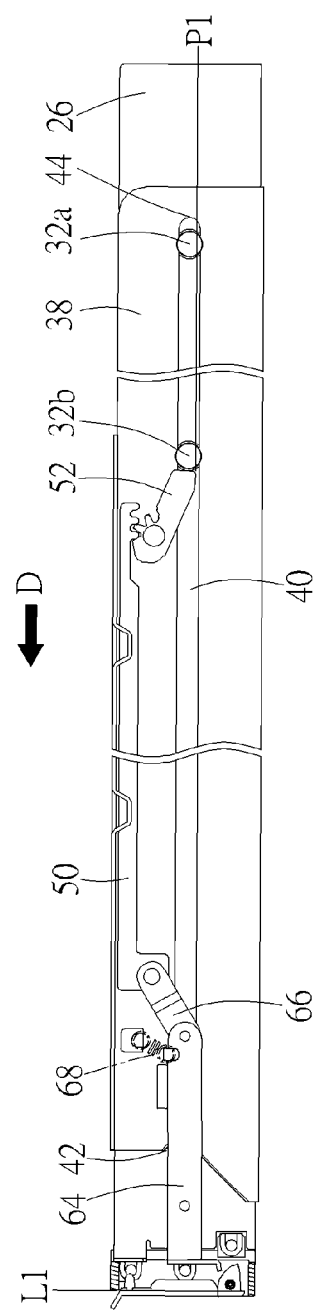
FIG. 7 is a diagram showing the object being mounted to a support element of the support assembly, and a blocking element blocking at least two mounting elements of the object according to an embodiment of the present invention.
Figure 8:
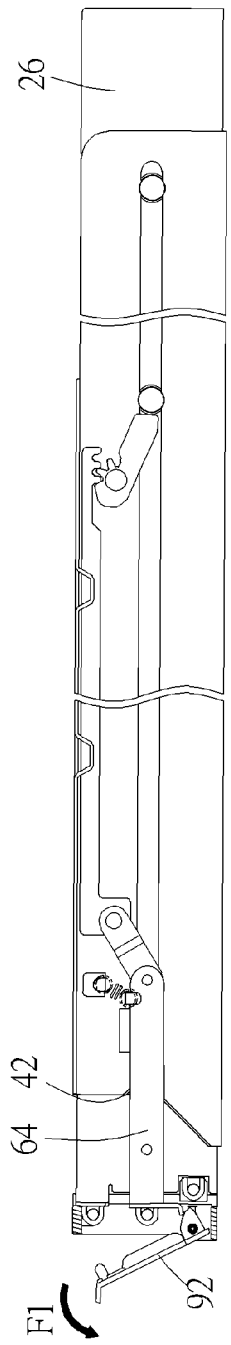
FIG. 8 is a diagram showing an opening element of the object in FIG. 7 being operated.

As shown in FIG. 7, when the object 26 is mounted to the support element 38, the first mounting element 32a and the second mounting element 32b of the object 26 enter the mounting path 40 from the entrance 42 of the support element 38 to be held in the mounting path 40 of the support element 38. Wherein, the first mounting element 32a of the object 26 is adjacent to the closed part 44 of the support element 38. On the other hand, the blocking element 52 is located at a first position P1 for blocking the mounting path 40 of the support element 38. For example, the blocking element 52 can block the second mounting element 32b for preventing the object 26 from moving relative to the support element 38 along a direction D. Preferably, through an elastic force provided by the elastic element 68, the operating element 64, the second linking element 66, the first linking element 50 and the blocking element 52 can be kept in a predetermined state. In the predetermined state, the blocking element 52 can be held at the first position P1 in response to the elastic force of the elastic element 68. As shown in FIG. 8, an user can apply a force F1 to the opening element 92 of the object 26.

Figure 9:
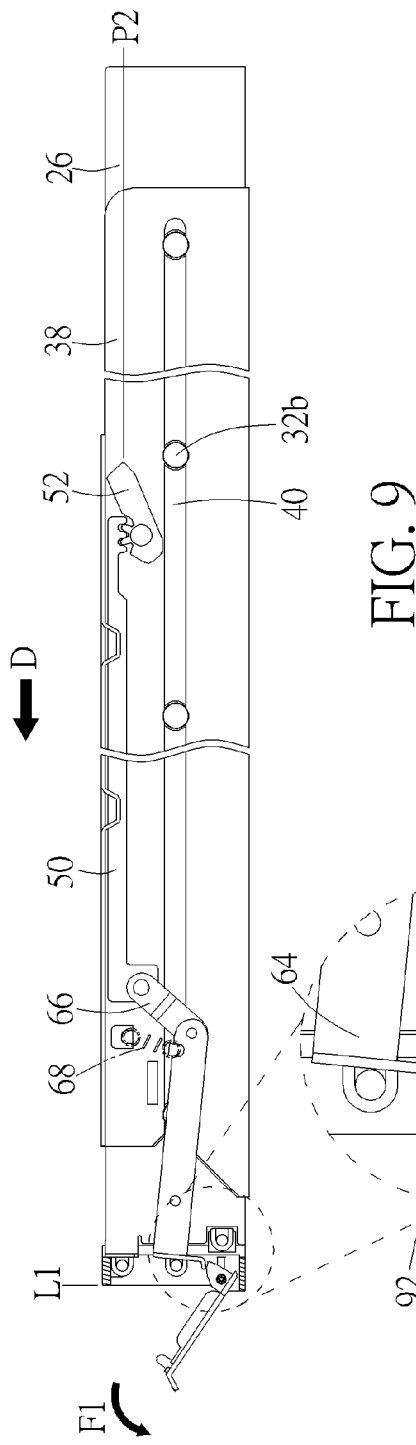
FIG. 9 is a diagram showing the opening element of the object in FIG. 8 being further operated, and the blocking element no longer blocking the at least two mounting elements of the object.

As shown in FIG. 9, when the user continues applying the force F1 to the opening element 92 of the object 26, the push part 96 of the opening element 92 can drive the operating element 64 (such as deflecting the operating element 64 an angle) for further driving the elastic element 68 to generate an elastic force in a stretched state, so as to sequentially drive the second linking element 66, the first linking element 50 and the blocking element 52, such that the blocking element 52 is moved from the first position P1 to a second position P2 and no longer blocks the mounting path 40 of the support element 38. That is to say, the first linking element 50 is configured to drive the blocking element 52 in response to the opening element 92 driving the operating element 64. In other words, the blocking element 52 can be moved from the first position P1 to the second position P2 in response to the user operating the opening element 92 of the object 26. When the blocking element 52 is located at the second position P2, the second mounting element 32b of the object 26 is not blocked by the blocking element 52, such that the object 26 is movable relative to the support element 38 along the direction D.

Figure 10:
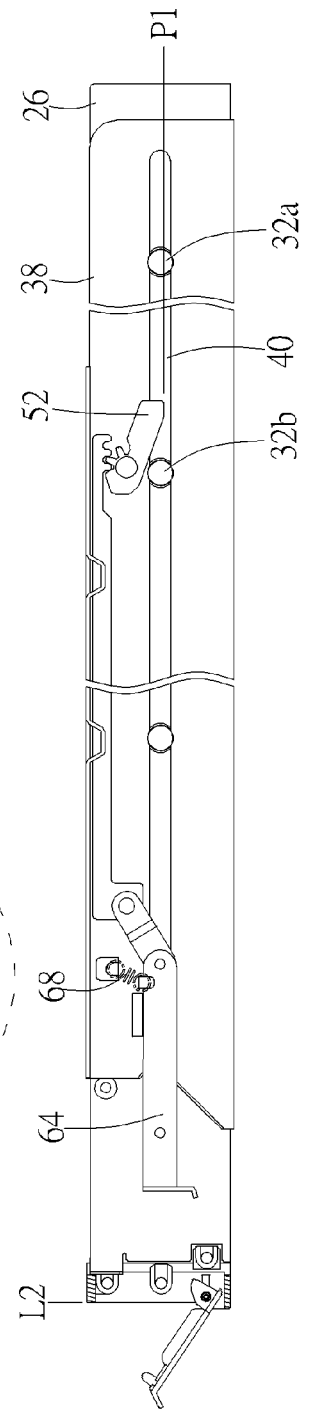
FIG. 10 is a diagram showing the object in FIG. 9 being moved along a direction, and a second mounting element of the object escaping from blocking of the blocking element.

As shown in FIG. 9 and FIG. 10, the operator can move the object 26 relative to the support element 38 along the direction D from a first mounting position L1 to a second mounting position L2, such that the second mounting element 32b of the object 26 is no longer blocked by the blocking element 52. Under such state, the operating element 64 is no longer pushed by the push part 96 of the opening element 92. Therefore, the elastic element 68 returns to an initial state from the stretched state, such that the blocking element 52 is moved from the second position P2 back to the first position P1 in response to the elastic force of the elastic element 68. The blocking element 52 thus blocks the mounting path 40 of the support element 38 again for blocking the first mounting element 32a of the object 26.

As shown in FIG. 11, the user can further move the object 26 relative to the support element 38 along the direction D from the second mounting position L2 to a third mounting position L3.

As shown in FIG. 11 and FIG. 12. When the object 26 is located at the second mounting position L2 or the third mounting position L3 relative to the support element 38, the operator can apply a force F2 to the operating element 64. When the force F2 is greater than the elastic force of the elastic element 68, the elastic element 68 is in the stretched state, and the operating element 64 can be deflected an angle for sequentially driving the second linking element 66, the first linking element 50 and the blocking element 52, such that the blocking element 52 is moved from the first position P1 to the second position P2 again and no longer blocks the mounting path 40 of the support element 38. Accordingly, the first mounting element 32a of the object is not blocked by the blocking element 52.

Figure 13:
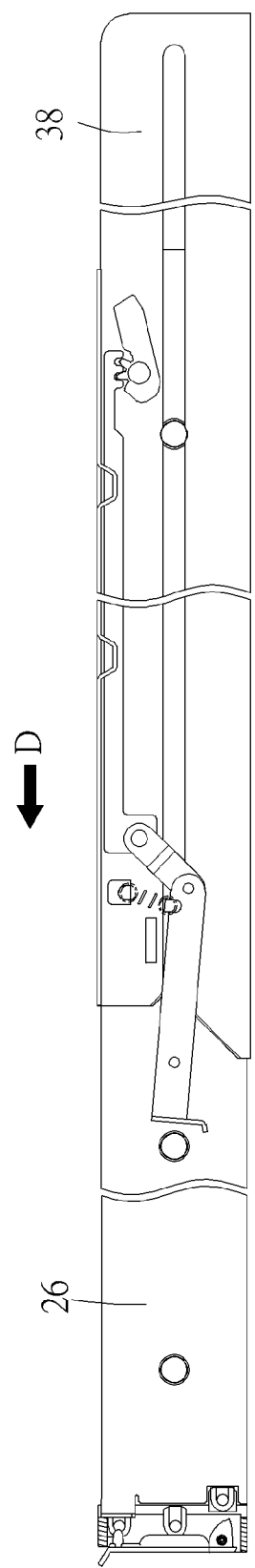
FIG. 13 is a diagram showing the object in FIG. 12 being further moved along the direction.

As shown in FIG. 13, the user can further move the object 26 from the third mounting position L3 relative to the support element 38 along the direction D for detaching the object 26 from the support element 38.

For consideration of safety, when the object 26 is mounted to the support element 38, at least two mounting element can be blocked by the blocking element 52. That is to say, when the first mounting element 32a and the second mounting element 32b of the object 26 are going to be detached from the mounting path 40 of the support element 38, the user needs to confirm and operate to drive the blocking element 52 to no longer block the mounting path 40, such that the first mounting element 32a and the second mounting element 32b can sequentially escape from blocking of the blocking element 52 in order to detach the object 26 from the support element 38.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A support device, configured to support an object comprising a plurality of mounting elements, the support device comprising:
    a support element, wherein a mounting path is formed on the support element for holding the plurality of mounting elements of the object;
    a first linking element;
    a blocking element configured to be driven by the first linking element to move;
    an operating element, wherein the first linking element is configured to drive the blocking element in response to operation of the operating element; and
    an elastic element arranged between the support element and the operating element, wherein the blocking element is held at a first position in response to an elastic force of the elastic element;
    wherein when the blocking element is located at the first position, the blocking element blocks the mounting path of the support element;
    wherein when the blocking element is located at a second position, the blocking element does not block the mounting path of the support element.

2. The support device of claim 1, further comprising a second linking element connected between the operating element and the first linking element.

3. The support device of claim 2, wherein the second linking element is pivoted to the operating element and the first linking element respectively by a first pivoting element and a second pivoting element.

4. The support device of claim 1, wherein the first linking element has a first engaging part, the blocking element has a second engaging part engaged with the first engaging part.

5. The support device of claim 1, wherein the support element comprises a base part and a vertical part bent from the base part, the base part is configured to support the object, the mounting path is located at the vertical part.

6. A support assembly, configured to support an object on a rack, the object comprising a plurality of mounting elements, the support assembly comprising:
    an auxiliary element configured to be mounted to the rack by a first bracket and a second bracket; and
    a support device attached to the auxiliary element, the support device comprising:
        a support element configured to support the object, wherein a mounting path is formed on the support element;

a first linking element;

a blocking element movably connected between the support element and the first linking element;

an operating element, wherein the first linking element is configured to drive the blocking element in response to operation of the operating element; and an elastic element arranged between the support element and the operating element, wherein the blocking element is held to block the mounting path in response to an elastic force of the elastic element;

wherein when the object is mounted to the support element, the mounting path of the support element is configured to hold the plurality of mounting elements of the object, and the blocking element blocks the mounting path of the support element in order to stop the object from moving relative to the support element along a direction;

wherein when the blocking element is driven by the first linking element to move, the blocking element no longer blocks the mounting path of the support element, such that the object is movable relative to the support element along the direction.

7. The support assembly of claim 6, wherein the object further comprises an opening element, when the object is located at a first mounting position relative to the support element, the first linking element is configured to drive the blocking element in response to the opening element of the object driving the operating element, such that one of the plurality of mounting elements of the object is not blocked by the blocking element, when the object is located at a second mounting position relative to the support element, the first linking element is configured to drive the blocking element in response to the operation of operating element, such that another one of the plurality of the mounting elements of the object is not blocked by the blocking element.

8. The support assembly of claim 6, further comprising a second linking element connected between the operating element and the first linking element, the second linking element pivoted to the operating element and the first linking element respectively by a first pivoting element and a second pivoting element.

9. The support assembly of claim 6, wherein the first linking element has a first engaging part, the blocking element has a second engaging part engaged with the first engaging part.

10. The support assembly of claim 6, further comprising a connecting element arranged between the support element and the auxiliary element, the connecting element comprising a first wing part, a second wing part and a protrusion part connected between the first wing part and the second wing part.

* * * * *